United States Patent
Chin et al.

(10) Patent No.: US 6,332,201 B1
(45) Date of Patent: Dec. 18, 2001

(54) TEST RESULTS CHECKING VIA PREDICTIVE-REACTIVE EMULATION

(75) Inventors: Richard Chin, Los Altos; Raghu Subramanian, Palo Alto, both of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/273,582

(22) Filed: Mar. 23, 1999

(51) Int. Cl.[7] .................................................. G06F 11/00
(52) U.S. Cl. .................................. 714/28; 703/14
(58) Field of Search .................. 714/28, 29, 25, 714/26, 33, 34, 37, 47; 703/14, 15, 20

(56) References Cited

U.S. PATENT DOCUMENTS

| | | | |
|---|---|---|---|
| 5,475,624 | * | 12/1995 | West ................................ 395/500.36 |
| 5,629,876 | * | 5/1997 | Huang et al. .................... 395/500.41 |
| 5,684,721 | * | 11/1997 | Swoboda et al. ..................... 364/578 |
| 5,715,433 | * | 2/1998 | Raghavan et al. ............... 395/500.42 |
| 5,946,472 | * | 8/1999 | Graves et al. ................... 395/500.44 |
| 6,006,022 | * | 12/1999 | Rhim et al. ..................... 395/500.02 |
| 6,032,268 | * | 2/2000 | Swoboda et al. ...................... 714/30 |
| 6,061,283 | * | 5/2000 | Takahashi et al. .................... 365/201 |
| 6,123,735 | * | 9/2000 | Raghavan et al. ..................... 703/21 |
| 6,154,801 | * | 11/2000 | Lowe et al. .......................... 710/119 |
| 6,223,272 | * | 4/2001 | Coehlo et al. ........................... 712/1 |

* cited by examiner

Primary Examiner—Nadeem Iqbal (57) ABSTRACT

A function for verifying the behavior of a digital system, where the digital system can exhibit several differing but valid behaviors from the same input. Identical input vectors are applied to both a hardware model and hardware emulator of the digital system via a simulator. Simulating the hardware emulator generates one or more predicted output vectors, while simulating the hardware model produces a single output vector. The output vector of the hardware model is then compared with the one or more predicted output vectors of the hardware emulator. If there is not an output match, an exception is raised. If the output vector of the hardware model matches one of the predicted output vectors of the hardware emulator, a rules checker applies a set of context specific rules defining a valid behavior to the current matching output vector, the internal model state information from the hardware emulator, and a history file of previous output vectors. If the current matching output vector passes the rules checker, the hardware emulator reacts by updating its internal state information and the verification continues with a new input vector, otherwise an exception is raised indicating a rules violation.

23 Claims, 5 Drawing Sheets

TEST RESULTS CHECKING VIA PREDICTIVE-REACTIVE EMULATION

THE FIELD OF THE INVENTION

The present invention relates to digital systems, and, more particularly to an apparatus and method for verifying the behavior of a digital system, where the digital system can exhibit several differing but valid behaviors from the same input vector.

BACKGROUND OF THE INVENTION

Simulating the behavior of digital systems can often produce ambiguous results. That is, for the same input, the digital system can exhibit several behaviors, all of which are equally valid and in accordance with the specifications. The behavior chosen by the system is a mere idiosyncrasy of the implementation.

One solution for dealing with ambiguous simulation results is the development of a very precise model of the digital system and tight checks on the expected results. The disadvantage of developing a very precise model arises when the system complexity escalates, or the system design evolves from its original definition. Maintaining such a precise model in the face of increased design complexity and a multitude of design changes results in a considerable development and maintenance effort.

Another solution for dealing with ambiguous simulation results is the development of a less stringent model of the digital system, and a looser set of rules to check the results. The disadvantage of developing a less stringent model is that with time, the model diverges from the actual system, and the rules to check the results become increasingly looser, until the model/rules become over-permissive and allow potential defects to slip through. This is especially true for complex concurrent systems with multiple simultaneous activities underway in different states of progress, such as a pipelined digital computer system.

In yet another solution, portholes are introduced into the model of the digital system in order to examine critical states that dictate the eventual outputs produced by the system. The disadvantage of this solution is that it only works in a simulation environment where the state is accessible. However, a digital system can not normally tolerate such an invasive internal examination. Moreover, for increasingly complex systems, the porthole method can be carried to an extreme that leaves the effort to check the design very tightly wed to the system being tested. Thus, the checker loses its independence in providing a valid check of the design in question.

In view of the above, there is a need for a functional testing system which allows the flexibility of building a relatively loose hardware emulator of a digital system, yet provides tighter checking through a set of pre-defined behavioral rules applied to the outputs of the hardware emulator of the digital system.

SUMMARY OF THE INVENTION

The present invention provides a functional testing system for verifying the behavior of a digital system. The functional testing system includes a plurality of input vectors, a hardware model representing a relatively low-level software characterization of the digital system, and a hardware emulator representing a relatively high-level software characterization of the digital system. The functional testing system also includes a system simulator for applying the plurality of input vectors to the hardware model and the hardware emulator, such that each input vector applied to the hardware model produces a corresponding model output vector, and each input vector applied to the hardware emulator produces one or more corresponding emulator output vectors. The functional testing system further includes a comparator for comparing each of the hardware emulator output vectors to the model output vector. If the model output vector matches one of the emulator output vectors, a match signal is activated and a current matching output vector is provided. The functional testing system also includes a history file for storing matching output vectors from the comparator, and a set of context specific rules defining a valid behavior for the list of matching output vectors stored in the history file. Finally, the functional testing system includes a rules checker which determines whether the current matching output vector is valid based on the history file, internal model state information from the hardware emulator, and the set of context specific rules.

In one embodiment, the context specific rules include rules on output ordering, output persistence, and data checking. In one embodiment of the present invention, the system simulator includes a separate model simulator for simulating the hardware model, and a separate predictive simulator for simulating the hardware emulator. In another embodiment of the present invention, if the comparator determines that there are no current matching output vectors between the hardware emulator and the hardware model for a given input vector, an exception is raised and the verification is terminated. If the rules checker determines that the current matching output vector is invalid, an exception is raised.

The present invention also provides a method for verifying the behavior of a digital system. The method begins by defining a hardware model representing a relatively low-level software characterization of the digital system. A hardware emulator is also defined representing a relatively high-level software characterization of the digital system. Next, a plurality of input vectors are defined. The hardware model and the hardware emulator are then simulated with a system simulator by applying the plurality of ordered input vectors to the hardware model and the hardware emulator. Each input vectors applied to the hardware model produces a corresponding model output vector, and each input vector applied to the hardware emulator produces one or more corresponding emulator output vectors. Next, each of the one or more emulator output vectors produced by the hardware emulator is compared to the model output vector. If the model output vectors matches one of the one or more emulator output vectors, a match signal is activated, a current matching output vector is provided, and the current matching output vector is stored in a history file. A set of context specific rules is then defined which describe a valid behavior for the ordered list of matching output vectors stored in the history file. Finally, the method determines whether the current matching output vector is valid based on the history file, the internal model state information from the hardware emulator, and the set of context specific rules.

The present invention further provides a computer readable medium containing instructions for controlling a computer system to verify the behavior of a digital computer system.

The present invention offers the advantage of a functional testing system which allows relatively loose hardware emulation of a digital system, yet provides tighter checking through a set of pre-defined behavioral rules applied to the outputs of the hardware emulator of the digital system.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
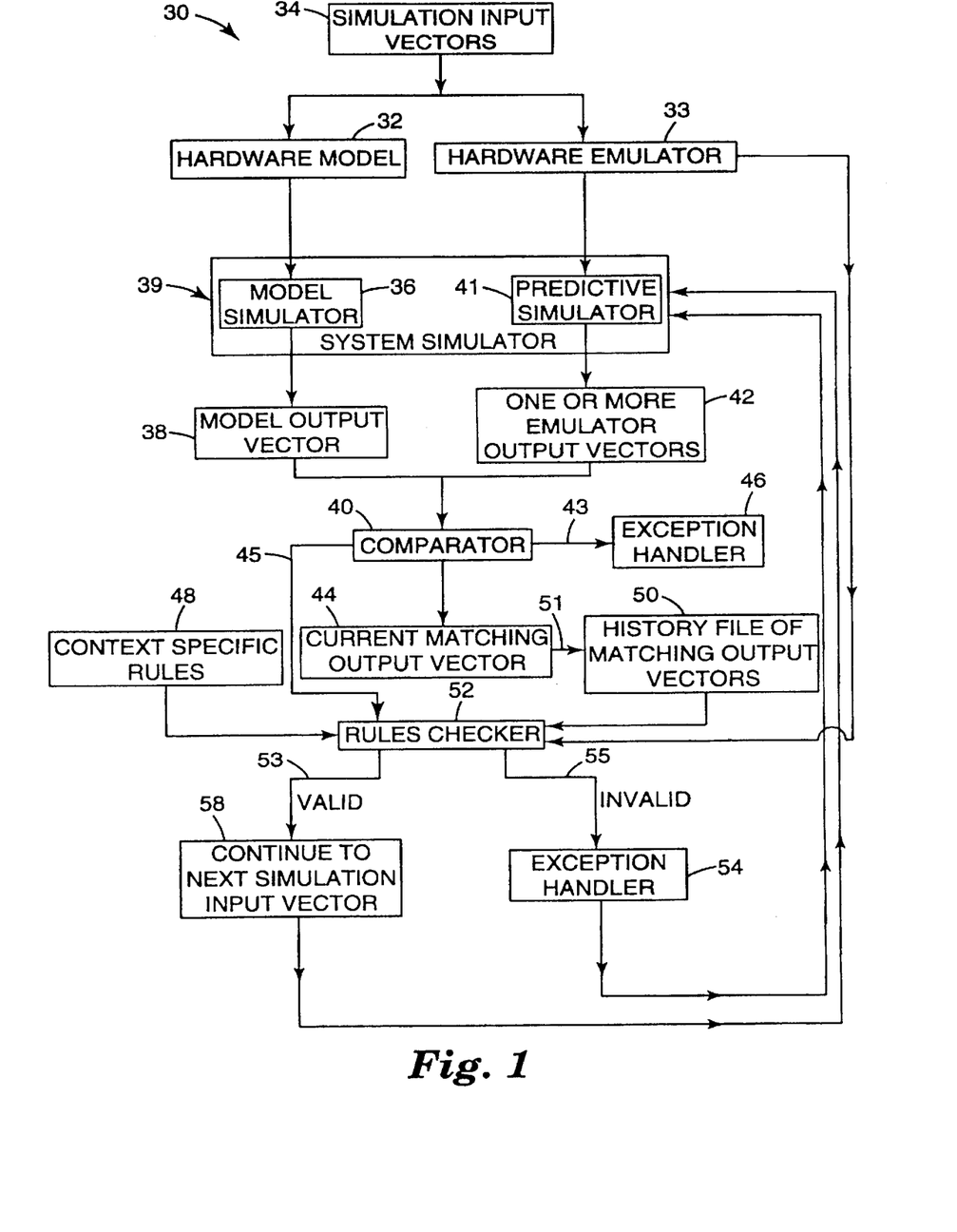
FIG. 1 is a functional block and flow diagram of a functional testing and verification environment in accordance with the present invention.

FIG. 1 is a functional block and flow diagram of a functional testing and verification environment 30 in accordance with the present invention. Functional testing and verification environment 30 includes a hardware model 32 of a corresponding digital system. Hardware model 32 is a relatively detailed, low-level software characterization of the corresponding digital system. Hardware model 32 is written in a hardware description language (HDL) such as Verilog or VHDL. Hardware model 32 is later synthesized and processed to form one or more integrated circuit chips containing the digital system.

Functional testing and verification environment 30 also includes a hardware emulator 33, which is a relatively high-level (i.e., behavioral) software characterization of the digital system. Hardware emulator 33 is a software module whose behavior matches the corresponding digital system, but whose implementation is simpler than hardware model 32. Hardware emulator 32 is written in any number of programming languages, such as C, C++, and PASCAL, and can be written in a hardware description language, such as Verilog or VHDL. Unlike hardware model 32, hardware emulator 33 does not suffer from constraints of the physical implementation, such as silicon area. Hardware emulator 33 also has no obligation to meet any physical constraints.

Functional testing and verification environment 30 also includes a set of simulation input vectors 34. Simulation input vectors 34 are applied simultaneously to the inputs of hardware model 32 and hardware emulator 33 in order to drive the simulation of the digital system. Simulation input vectors 34 are specifically developed to thoroughly test functional areas within hardware model 32 and hardware emulator 33.

Functional testing and verification environment 30 includes a system simulator 39 which, in a preferred embodiment, further includes a model simulator 36 and a predictive simulator 41. Model simulator 36 simulates the operation of the digital system by serially passing simulation input vectors 34 through hardware model 32 to produce a single model output vector 38 for each input vector 34 passed through the model simulator 36. Model simulator 36 can be any of a number of commercially available functional simulators. In a preferred embodiment, model simulator 36 is a Verilog type simulator. Verilog is an IEEE standard hardware description language that is maintained by the Design Automation Standards Committee.

A predictive simulator 41 simulates the operation of hardware emulator 33 by serially passing simulation input vectors 34 through the hardware emulator to produce one or more emulator output vectors 42 for each simulation input vector 34 passed through hardware emulator 33. If two or more emulator output vectors 42 are consistent with the specification of the corresponding digital system for a given simulation input vector 34, hardware emulator 33 produces all of the two or more emulator output vectors 42 which represent legitimate possibilities for the given simulation input vector 34.

Comparator 40 compares model output vector 38 generated by the simulation of hardware model 32 with one or more emulator output vectors 42 generated by the simulation of hardware emulator 33. If the model output vector 38 does not match any of the one or more emulator output vectors 42, comparator 40 activates a non-match signal 43. An exception handler 46 raises an exception in response to the activated non-match signal 43, and attempts to continue the verification of the digital system. If the verification cannot be continued, verification of the digital system is then terminated.

Alternatively, if the model output vector 38 matches one of the one or more output vectors 42, comparator 40 provides a current matching output vector 44. Current matching output vector 44 is appended to a history file 50 of matching output vectors via path 51. History file 50 stores an ordered list of matching output vectors 44 generated during the current simulation.

Functional testing and verification environment 30 also includes a pre-defined set of context specific rules 48, which define a valid behavior for matching output vectors 44. Example context specific rules 48 include rules defining ordering, persistence, and signal group/bus behavior requirements of matching output vectors 44 to indicate successful verification of the operation of the corresponding digital system.

Rather than requiring a rigid ordered sequence of simulation results from the digital system, context specific rules 48 related to ordering allow a verification engineer to define only the ordering relationships critical to the operation of digital system. An example context specific rule 48 related to ordering reads: "on output port 3, A must never follow B on the next clock cycle." In this example context specific rule, "A" and "B" represent two sets of simulation results (simulation output vectors) which are generated at the output ports of the digital system, where simulation output vector "A" must never follow simulation output vector "B" on the next clock cycle of the verification of the digital system.

Context specific rules 48 related to data persistence allow the verification engineer to define the number of clock cycles a given output can persist on an output port without causing a violation. An example context specific rule 48 related to persistence reads: "on output port 4, A must not persist for 5 or more clock cycles". In this example context specific rule, "A" represents a simulation result generated at the output ports of the digital system, where the same simulation result "A" must not persist at the output ports of the digital system for 5 or more consecutive clock cycles.

A In one embodiment, context specific rules 48 related to port grouping/bus behavior enable the verification engineer to verify the expected value of an entire accompanying "data packet" provided on a data bus between observed and expected results. An example context specific rule 48 related to port grouping/bus behavior reads: "Output ports 1–32 (data bus 1) must never be static for longer than 3 clock cycles". In this example, output ports 1–32 are defined to represent a data bus within the simulation output vector. Rather than defining the behavior of the entire simulation output vector as a whole, or only a single port within the simulation output vector, this rule enables behavior checking on a defined subset of the entire simulation output vector (such as ports comprising a data bus).

Functional testing and verification environment 30 further includes a rules checker 52 which receives context specific rules 48, the current matching output vector 44, the match signal 45, internal model state information from hardware emulator 33 and the history file 50 of matching output vectors. Rules checker 52 responds to an activated match signal 45 to apply context specific rules 48 against history file 50 of matching output vectors to determine whether the current matching output vector 44 is valid. If rules checker 52 determines that current matching output vector 44 is invalid, rules checker 52 activates an invalid signal 55. An exception handler 54 raises an exception in response to the activated invalid signal 55 and attempts to continue the verification of the digital system by system simulator 39. If rules checker 52 determines that the current matching output vector 44 is valid, rules checker 52 activates valid signal 53. A block 58 responds to the activated valid signal 53 to cause system simulator 39 to continue verification of the corresponding digital system 34.

Rules checker 52 also examines internal model state information within hardware emulator 33 to determine the validity of the generated simulation results. As an example, the examination of internal model state information becomes critical when hardware emulator 33 has begun a parallel processing operation which may or may not be applied based on the outcome of a future event. If, upon examination, rules checker 52 determines that there is a problem with the internal model state information, exception handler 54 raises an exception, and attempts to continue the verification of the digital system. If the verification cannot be continued, verification of the digital system is then terminated.

Figure 2:
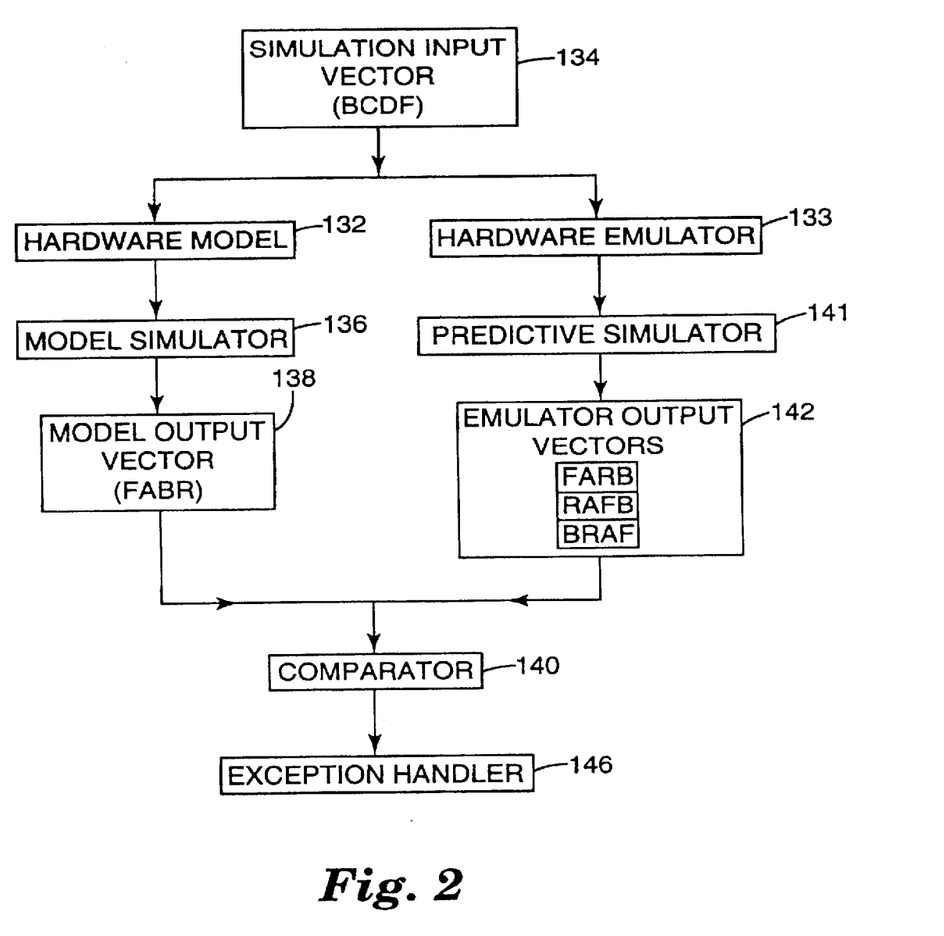
FIG. 2 is a block and flow diagram illustrating a first example verification of a digital system where a test vector is concurrently applied to a hardware model and a hardware emulator.

FIG. 2 is a block and flow diagram illustrating a first example where a simulation input vector 134 is concurrently applied to a hardware model 132 and a hardware emulator 133 for a digital system via model simulator 136 and predictive simulator 141, respectively. In this example, the simulation input vector 134 is represented as "BCDF" and is applied concurrently to the inputs of hardware model 132 and hardware emulator 133, such that "B" represents the portion of simulation input vector 134 applied to a first input port of hardware model 132 and hardware emulator 133, "C" represents the portion of simulation input vector 134 applied to a second input port of hardware model 132 and hardware emulator 133, "D" represents the portion of simulation input vector 134 applied to a third input port of hardware model 132 and hardware emulator 133, and "F" represents the portion of simulation input vector 134 applied to a fourth input port of hardware model 132 and hardware emulator 133.

After simulation input vector "BCDF" has been applied to the input ports of hardware model 132, hardware model 132 generates a corresponding model output vector represented as "FABR" 138, such that "F" represents the simulation result at a first output port of hardware model 132, "A" represents the simulation result at a second output port of hardware model 132, "B" represents the simulation result at a third output port of hardware model 132, and "R" represents the simulation result at a fourth output port of hardware model 132.

At approximately the same time as simulation input vector "BCDF" is applied to the input ports of hardware model 132, simulation input vector "BCDF" is also applied to the input ports of hardware emulator 133. Predictive simulator 141 generates a set of three emulator output vectors 142, represented as: "FARB", "RAFB", and "BRAF".

Comparator 140 then compares model output vector "FABR" against each of the three emulator output vectors "FARB", "BRAF", and "BRAF" to determine if there are any matching output vectors. In this example, there are no matching output vectors detected by comparator 140, resulting in an exception being raised. If possible, the verification may be continued after raising the exception to see how the consequential behavior of the error will manifest itself. If the verification cannot be continued, the verification is terminated by exception handler 146.

Figure 3:
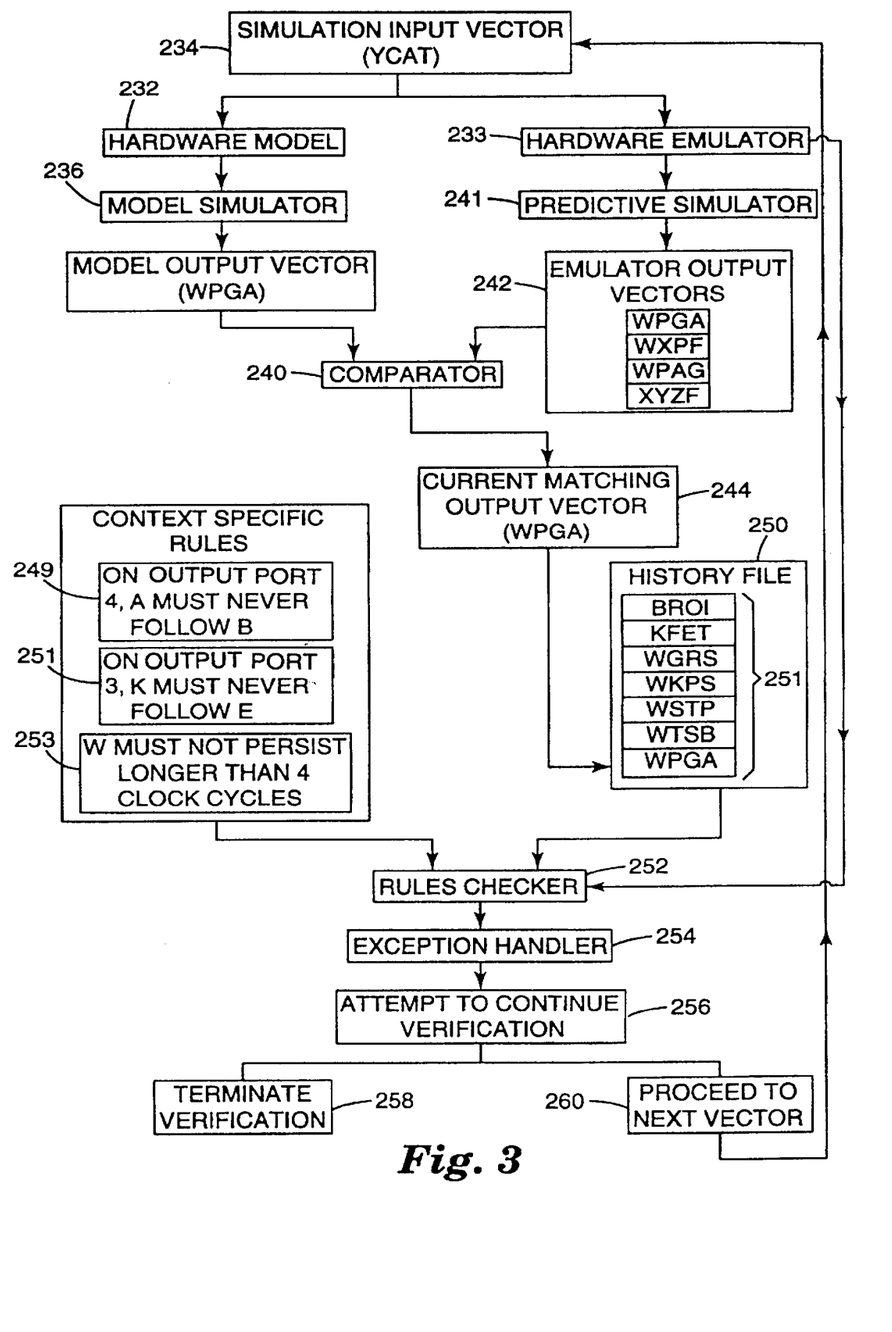
FIG. 3 is a second block and flow diagram illustrating a second example verification of a digital system where a test vector is concurrently applied to the hardware model and a hardware emulator.

FIG. 3 is a block and flow diagram illustrating a second example verification where a simulation input vector 234 is concurrently applied to a hardware model 232 and a hardware emulator 233 for a digital system via model simulator 236 and predictive simulator 241, respectively. In this example, the simulation input vector is represented as "YCAT" 234 and is applied concurrently to the inputs of hardware model 232 and hardware emulator 233, such that "Y" represents the portion of simulation input vector 234 applied to a first input port of hardware model 232 and hardware emulator 233, "C" represents the portion of simulation input vector 234 applied to a second input port of hardware model 232 and hardware emulator 233, "A" represents the portion of simulation input vector 234 applied to a third input port of hardware model 232 and hardware emulator 233, and "T" represents the portion of simulation input vector 234 applied to a fourth input port of hardware model 232 and hardware emulator 233.

After simulation input vector "YCAT" has been applied to the input ports of hardware model 232, model simulator 236 generates a corresponding model output vector represented as "WPGA" 238, such that "W" represents the simulation result at a first output port of hardware model 232, "P" represents the simulation result at a second output port of hardware model 232, "G" represents the simulation result at a third output port of hardware model 232, and "A" represents the simulation result at a fourth output port of hardware model 232 .

At approximately the same time as simulation input vector "YCAT" 234 is applied to the input ports of hardware model 232, simulation input vector "YCAT" is also applied to the input ports of hardware emulator 233. Predictive simulator 241 generates a set of four emulator output vectors 242, represented as: "WPGA", "WXPF", "WPAG", and "XYZF".

Comparator 240 then compares model output vector "WPGA" against each of the four emulator output vectors "WPGA", "WXPF", "WPAG" and "XYZF" to determine if there are any matching output vectors. In this example, model output vector "WPGA" matches emulator output vector "WPGA", to produce a current matching output vector "WPGA" 244. Since the model output vector "WPGA" matches the emulator output vector "WPGA", a match signal 250 is generated.

In this example, context specific rules file 248 contains three user-defined rules. A first ordering type rule 249 states that "A" must never follow "B" on output port 4 within the matching output vectors 255 contained within history file 250. A second ordering type rule 251 states that "K" must never follow "E" on output port 3 within the matching output vectors 255 contained in history file 250. A persistence rule 253 states that "W" must not persist longer than 4 clock cycles on output port 1.

In one embodiment, history file 250 stores each current matching output vector 244 as it is provided from comparator 240 and retains all matching output vectors 251 produced in the current verification run. The rules checker accepts history file 250, current matching output vector 244 and context specific rules file 248 as input. Upon receiving match signal 45, rules checker 252 applies rules 249, 251 and 253 to history file 250 and current matching output vector 244 in order to determine the validity of the current matching output vector 244 in view of sequence of matching output vectors 255. Rules checker 252 also examines current internal model state information from hardware emulator 233 when determining the validity of the current matching output vector 244.

First rule 249 states that "A" must never follow "B" on output port 4 within the set of matching output vectors 252 contained in history file 250. In the illustrated example, "A" follows "B" on port 4, as shown in matching output vectors (6) and (7) of history file 250. Thus, the current matching output vector violates first rule 249.

Second rule 251 states that "K" must never follow "E" on output port 3 within the set of matching output vectors 252 contained in history file 250. In the illustrated example, "K" never follows "E" on port 3 of the matching output vectors contained within history file 250, thus second rule 251 has not been violated by the current matching output vector.

Third rule 253 states that "W" must not persist longer than 4 clock cycles on output port 1 within the set of matching output vectors 252 contained in history file 250. In the illustrated example, "W" persists on port 1 of matching output vectors (3)–(7) for 5 cycles, thus violating third rule 253.

Because first rule 249 and third rule 253 have been violated by current matching output vector 244, rules checker 252 activates an invalid signal 255. An exception handler 254 raises an exception in response to the activated signal 255 and attempts to continue the verification of the digital system by the system simulator 239. If the attempt to continue the verification is successful, the verification proceeds to the next input vector, otherwise the verification is terminated.

Figure 4:
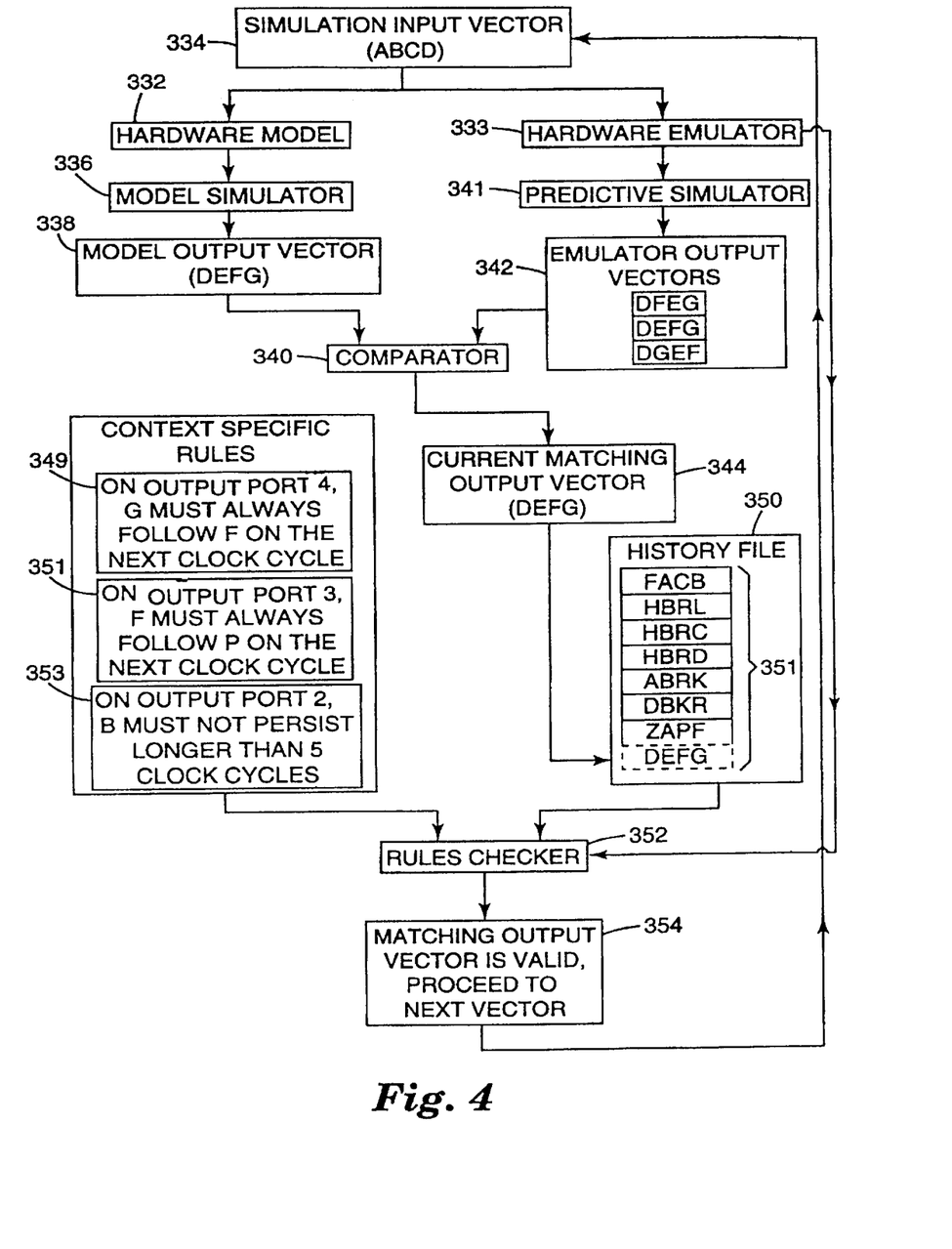
FIG. 4 is a block and flow diagram illustrating a third example verification of a digital system where a test vector is concurrently applied to a hardware model and a hardware emulator.

FIG. 4 is a block and flow diagram illustrating a third example where a simulation input vector 334 is concurrently applied to a hardware model 332 and a hardware emulator 333 for a digital system via model simulator 336 and predictive simulator 341, respectively. In this example, the simulation input vector is represented as "ABCD" 334 and is applied concurrently to the inputs of hardware model 332 and hardware emulator 333, such that "A" represents the portion of simulation input vector 334 applied to a first input port of hardware model 332 and hardware emulator 333, "B" represents the portion of simulation input vector 334 applied to a second input port of hardware model 332 and hardware emulator 333, "C" represents the portion of simulation input vector 334 applied to a third input port of hardware model 332 and hardware emulator 333, and "D" represents the portion of simulation input vector 334 applied to a fourth input port of hardware model 332 and hardware emulator 333.

After simulation input vector "ABCD" has been applied to the input ports of hardware model 332, model simulator 336 generates a corresponding model output vector represented as "DEFG" 138, such that "D" represents the simulation result at a first output port of hardware model 332, "E" represents the simulation result at a second output port of hardware model 332, "F" represents the simulation result at a third output port of hardware model 332, and "G" represents the simulation result at a fourth output port of hardware model 332.

At approximately the same time as simulation input vector "ABCD" 334 is applied to the input ports of hardware model 332, simulation input vector "ABCD" is also applied to the input ports of hardware emulator 333. Predictive simulator 341 generates a set of three emulator output vectors 342, represented as: "DFEG", "DEFG", and "DGEF".

Comparator 340 then compares model output vector "DEFG" against each of the three emulator output vectors "DFEG", "DEFG", and "DGEF" to determine if there are any matching output vectors. In this example, model output vector "DEFG" matches emulator output vector "DEFG", to produce a current matching output vector "DEFG", indicated at 344. Since the model output vector "DEFG" matches the emulator output vector "DEFG", a match signal 345 is generated.

In this example, context specific rules file 348 contains three userdefined rules. A first ordering type rule 349 states that "G" must always follow "F" on the next cycle of output port 4 within the matching output vectors 355 contained within history file 350. A second ordering type rule 351 states that "F" must always follow "P" on the next cycle of output port 3 within the matching output vectors 355 contained in history file 350. A persistence rule 353 states that "B" must not persist longer than 5 clock cycles on output port 2.

Matching output vector 344, history file 350, and context specific rules file 348 are passed as input to rules checker 352. Upon receiving match signal as 45, rules checker 352 applies rules 349, 351 and 353 to history file 350 and current matching output vector 344 in order to determine the validity of the current matching output vector 344 in view of sequence of matching output vectors 355 contained in history file 350 and current internal model state information present in hardware emulator 333.

First rule 349 states that "G" must always follow "F" on the next cycle on output port 4 within the set of matching output vectors 352 contained in history file 350. In the illustrated example, "G" never follows "F" on the next cycle of port 4 of the matching output vectors contained within history file 350, thus, there are no violations of first rule 349.

Second rule 351 states that "F" must always follow "P" on the next cycle on output port 3 within the set of matching output vectors 352 contained in history file 350. In the illustrated example, "F" never follows "P" on port 3 of the matching output vectors contained within history file 350, thus second rule 351 has not been violated by the current matching output vector.

Third rule 353 states that "B" must not persist longer than 5 clock cycles on output port 2 within the set of matching output vectors 352 contained in history file 350. In the illustrated example, "W" persists on port 1 of matching output vectors (2)–(6) for 5 cycles, thus there is no violation of third rule 353.

Because no rules have been violated by matching output vector 344, the verification proceeds to the generation of the next simulation input vector 334, as illustrated at 358.

Figure 5:
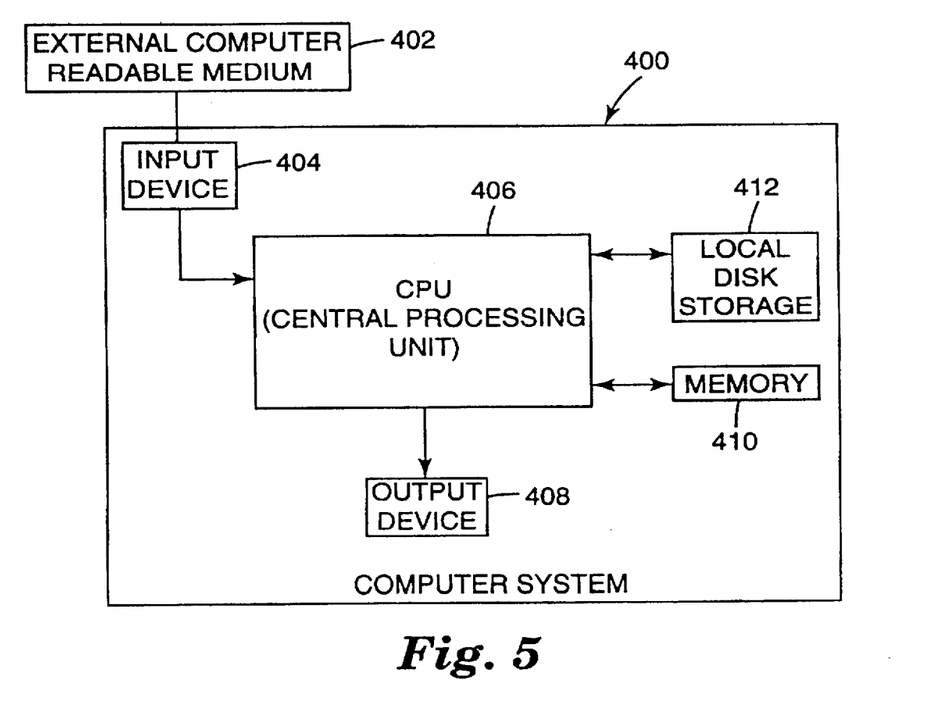
FIG. 5 is a computer readable medium incorporating the functional testing system of the present invention.

FIG. 5 illustrates a computer system 400 and an external computer readable medium 402 incorporating the functional testing system in accordance with the present invention. Embodiments of external computer readable medium 402 include but are not limited to: a CD-ROM, a floppy disk, and a disk cartridge. Functional testing system of the present invention can be implemented in a variety of compiled and interpreted computer languages. External computer readable medium 402 stores source code, object code, executable code, shell scripts and/or dynamic link libraries for the functional testing system. An input device 404 reads external computer readable medium 402 and provides this data to computer system 400. Embodiments of input device 404 include but are not limited to: a CD-ROM reader, a floppy disk drive, and a data cartridge reader.

Computer system 400 includes a central processing unit 406 for executing the functional testing system. Computer system 400 also includes local disk storage 412 for locally storing the functional testing system before, during and after execution. The functional testing system and its associated environment also utilizes memory 410 within the computer system during execution. Upon execution of the functional testing system, output data is produced and directed to output device 408. Embodiments of output device 408 include but are not limited to: a computer display device, a printer, and/or a disk storage device.

The present invention provides key advantages over presently available tools and methods for verifying the behavior of a digital system 30. The present invention provides a hardware emulator 33 which during verification may exhibit several differing but valid behaviors for the same simulation input vector 34 in the form of one or more emulator output vectors 42. The emulator output vectors 42 are compared with a single model output vector 38 generated by a hardware model 32 concurrently undergoing verification. Since the hardware emulator 33 may provide several potential matching output vectors for each model output vector 38 generated from a common simulation input vector, the present invention first checks results between the hardware model 32 and the hardware emulator 33 of a digital system, which provided a relatively loose check of the behavior of the digital system.

Additionally, the present invention incorporates a rules checker 52 which provides a second, tighter check of the behavior of a digital system when the output vectors hardware model 32 and hardware emulator 33 produce a matching output vector 44 from the same simulation input vector 34. A set of user-defined, context-specific rules 48 provide a relatively simple way for a verification engineer to define a valid behavior for the digital system. Rules checker 52 applies context-specific rules 48 against a current matching output vector 44, and a history file 50 including previous matching output vectors to determine if the current matching output vector exhibits a valid behavior. Thus, rules checker 52 provides the advantage of a somewhat "tighter" verification of the behavior of the digital system, without requiring an overly-restrictive, vector-to-vector match between the results of the hardware model and hardware simulator. By utilizing a relatively small set of context-specific rules to describe valid behavior for the digital system, complex internal state information does not need to be maintained within hardware emulator 33, resulting in greater speed and less complexity.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the electrical and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A functional testing system for verifying the behavior of a digital system, the system comprising:

a plurality of input vectors;

a hardware model representing a relatively low-level software characterization of the digital system;

a hardware emulator representing a relatively high-level software characterization of the digital system, wherein the hardware emulator is capable of storing internal model state information;

a system simulator for applying the plurality of input vectors to the hardware model and the hardware emulator, wherein each input vector applied to the hardware model produces a corresponding model output vector and wherein each input vector applied to the hardware emulator produces one or more corresponding emulator output vectors;

a comparator comparing each of the one or more emulator output vectors to the model output vector, activating a match signal if the model output vector matches one of the one or more emulator output vectors, and providing a current matching output vector;

a history file storing matching output vectors from the comparator;

a set of context specific rules defining a valid behavior for the list of matching output vectors stored in the history file; and a rules checker determining whether the current matching output vector is valid based on the history file, the internal model state information from the hardware emulator, the set of context specific rules, and the current matching output vector.

2. The functional testing system of claim 1, wherein the context specific rules include rules on output ordering.

3. The functional testing system of claim 1, wherein the context specific rules include rules on output persistence.

4. The functional testing system of claim 1, wherein the context specific rules include rules on port grouping/bus behavior.

5. The functional testing system of claim 1, wherein the system simulator includes:

a model simulator for simulating the hardware model; and a predictive simulator for simulating the hardware emulator.

6. The functional testing system of claim 1, wherein the hardware model is synthesized and processed to form the digital system.

7. The functional testing system of claim 1, wherein if the comparator determines that there are no current matching output vectors between the hardware emulator and the hardware model for a given input vector, an exception handler raises an exception.

8. The functional testing system of claim 1, wherein if the rules checker determines that the current matching output vector is invalid, an exception handler raises an exception.

9. The functional testing system of claim 1, wherein if the rules checker detects a problem with the internal model state information, an exception handler raises an exception.

10. A method for verifying the behavior of a digital system, the method comprising:

defining a hardware model representing a relatively low-level software characterization of the digital system;

defining a hardware emulator representing a relatively high-level software characterization of the digital system, wherein the hardware emulator is capable of storing internal model state information;

defining a plurality of input vectors;

simulating the hardware model and the hardware emulator by applying the plurality of ordered input vectors to the hardware model and the hardware emulator, wherein each input vectors applied to the hardware model produces a corresponding model output vector, and each input vector applied to the hardware emulator produces one or more corresponding emulator output vectors;

comparing each of the one or more emulator output vectors produced by the hardware emulator to the model output vector;

activating a match signal if the model output vector matches one of the one or more emulator output vectors;

providing a current matching output vector if the model output vector matches one of the one or more emulator output vectors;

storing matching output vectors in a history file;

defining a set of context specific rules which define a valid behavior for the ordered list of matching output vectors stored in the history file; and determining whether the current matching output vector is a valid based on the history file, the internal model state information from the hardware emulator, the set of context specific rules, and the current matching output vector.

11. The method of claim 10, wherein the step of defining the set of context specific rules includes the step of defining rules on output ordering.

12. The method of claim 10, wherein the step of defining the set of context specific rules includes the step of defining rules on output persistence.

13. The method of claim 10, wherein the step of defining the set of context specific rules includes the step of defining rules on port grouping/bus behavior.

14. The method of claim 10, wherein the hardware model is synthesized and processed to form the digital system.

15. The method of claim 10, further comprising the steps of raising an exception if the comparing step determines that there are no current matching output vectors between the hardware emulator and the hardware model for a given input vector.

16. The method of claim 10, further comprising the step of raising an exception if the determining step determines that the current matching output vector is invalid.

17. A computer readable medium containing instructions for controlling a computer system to perform a method for verifying the behavior of a digital system, comprising the steps of:

defining a hardware model representing a relatively low-level software characterization of the digital system;

defining a hardware emulator representing a relatively high-level software characterization of the digital system, wherein the hardware emulator is capable of storing internal model state information;

defining a plurality of input vectors;

simulating the hardware model and the hardware emulator with a system simulator by applying the plurality of ordered input vectors to the hardware model and the hardware emulator, wherein each input vectors applied to the hardware model produces a corresponding model output vector, and each input vector applied to the hardware emulator produces one or more corresponding emulator output vectors;

comparing each of the one or more emulator output vectors produced by the hardware emulator to the model output vector;

activating a match signal if the model output vector matches one of the one or more emulator output vectors;

providing a current matching output vector if the model output vector matches one of the one or more emulator output vectors;

storing matching output vectors in a history file;

defining a set of context specific rules which define a valid behavior for the ordered list of matching output vectors stored in the history file; and determining whether the current matching output vector is a valid based on the history file, the internal model state information from the hardware emulator, the set of context specific rules, and the current matching output vector.

18. The computer readable medium of claim 17, wherein the context specific rules include rules on output ordering.

19. The computer readable medium of claim 17, wherein the context specific rules include rules on output data persistence.

20. The computer readable medium of claim 17, wherein the context specific rules include rules on port grouping/bus behavior.

21. The computer readable medium of claim 17, wherein the hardware model is synthesized and processed to form the digital system.

22. The computer readable medium of claim 17, wherein if the comparator determines that there are no current matching output vectors between the hardware emulator and the hardware model for a given input vector, an exception is raised by an exception handler.

23. The computer readable medium of claim 17, wherein if the rules checker determines that the current matching output vector is invalid, an exception is raised by an exception handler.

* * * * *